(12) United States Patent
Nakamura et al.

(10) Patent No.: US 8,449,691 B2
(45) Date of Patent: May 28, 2013

(54) LIQUID SOLVENT ABUTMENT UNIT

(75) Inventors: Akihiko Nakamura, Kawasaki (JP);
Atsushi Miyanari, Kawasaki (JP);
Yoshihiro Inao, Kawasaki (JP);
Yasumasa Iwata, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 649 days.

(21) Appl. No.: 12/448,916

(22) PCT Filed: Jan. 11, 2008

(86) PCT No.: PCT/JP2008/000017
§ 371 (c)(1),
(2), (4) Date: Jul. 15, 2009

(87) PCT Pub. No.: WO2008/087855
PCT Pub. Date: Jul. 24, 2008

(65) Prior Publication Data
US 2010/0024853 A1 Feb. 4, 2010

(30) Foreign Application Priority Data
Jan. 19, 2007 (JP) ................................ 2007-010335

(51) Int. Cl.
*B08B 3/00* (2006.01)
(52) U.S. Cl.
USPC ........................................ 134/56 R; 156/703
(58) Field of Classification Search
None
See application file for complete search history.

(56) References Cited

U.S. PATENT DOCUMENTS

| 6,066,575 A | * | 5/2000 | Reardon et al. | ............... 438/782 |
| 7,268,061 B2 | | 9/2007 | Miyanari et al. | |
| 2005/0087133 A1 | * | 4/2005 | Shindo et al. | ................. 118/715 |
| 2005/0170612 A1 | | 8/2005 | Miyanari et al. | |
| 2005/0173064 A1 | | 8/2005 | Miyanari | |

FOREIGN PATENT DOCUMENTS

| JP | 2005-191535 | 7/2005 |
| JP | 2005-191550 | 7/2005 |
| JP | 2006-156683 | 6/2006 |
| KR | 10-2005-0053019 | 6/2005 |

OTHER PUBLICATIONS

Korean Office Action (along with English translation) issued Feb. 16, 2011 in Application No. 10-2009-7016861.
International Search Report issued Feb. 12, 2008 in the International (PCT) Application No. PCT/JP2008/000017.

* cited by examiner

*Primary Examiner* — Michael Barr
*Assistant Examiner* — Jason Ko
(74) *Attorney, Agent, or Firm* — Wenderoth, Lind & Ponack, L.L.P.

(57) ABSTRACT

In order to provide a liquid solvent abutment unit for accelerating the reaction of a liquid solvent against an adhesive member existing between a perforated support plate and a wafer, a liquid solvent abutment unit includes a supply part for supplying a support plate surface with a liquid solvent, a retention part for retaining the supplied liquid solvent in the hole-formed region on the support plate surface; a recovery part for recovering the liquid solvent retained in the hole-formed region, and a vibration unit for vibrating the liquid solvent.

6 Claims, 4 Drawing Sheets

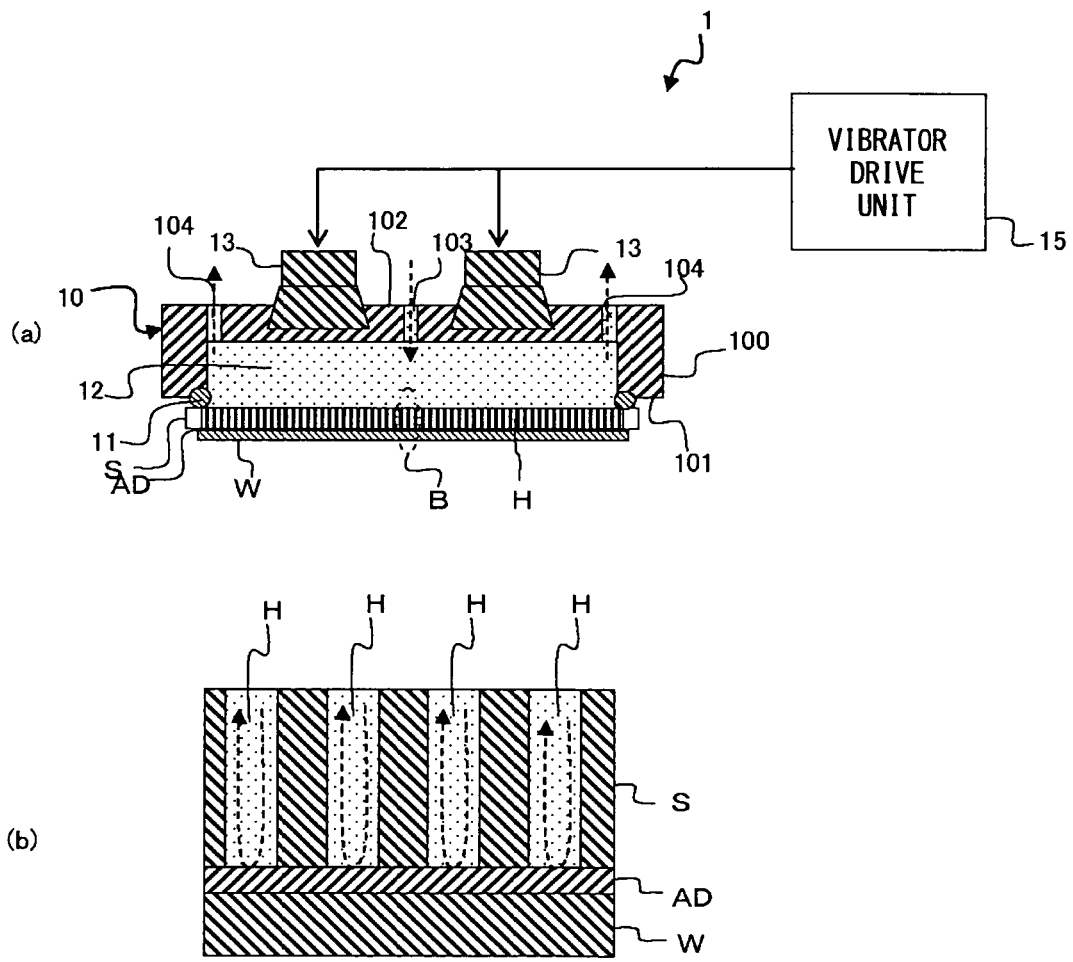
F I G. 2

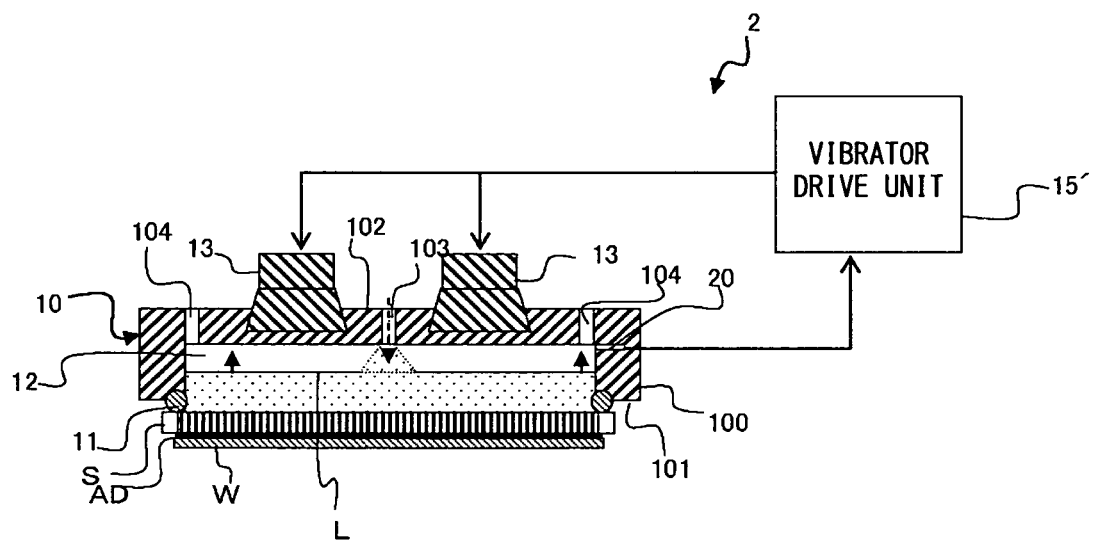
F I G. 3

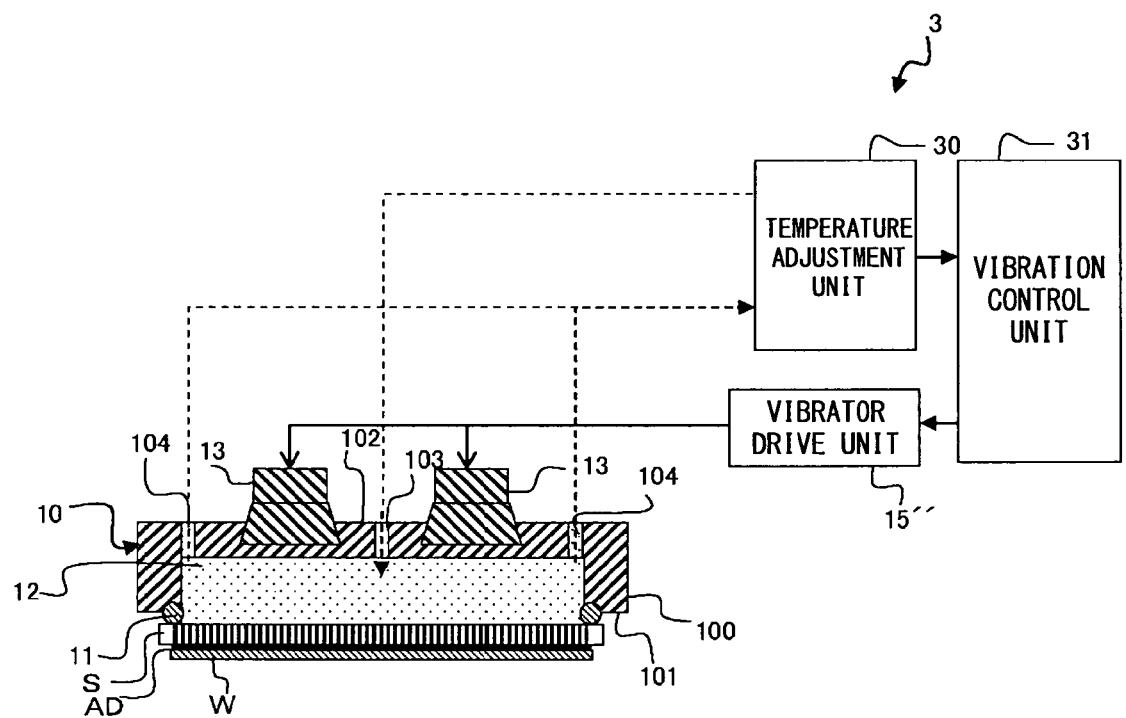
F I G. 4

LIQUID SOLVENT ABUTMENT UNIT

BACKGROUND OF THE INVENTION

I. Technical Field

The present invention relates to a unit for dissolving, with a liquid solvent, an adhesive member (such as adhesive and adhesive sheet) that sticks two bodies together.

II. Description of the Related Art

In recent years, techniques for thinning a wafer and peripheral techniques have been gathering attention. When a wafer is thinned, the strength of the surface is reduced and warping is generated over the entirety of the surface. Because of this, support is required using another support member when handling the wafer. Therefore, the surface strength of a wafer that is to be thinned is reinforced, for example, by pre-attaching a support plate made of glass, iron-nickel alloy or the like to the wafer, and thereby it is handled in such a way so as to cause no warping.

The above described support plate is adhesively attached to a wafer by using a member possessing adhesiveness between the support plate and the wafer. After the wafer is thinned, the support member is no longer required and therefore it is detached from the wafer. Specifically, the support plate is attached to the wafer using an adhesive member such as adhesive and therefore the wafer is detached from the support plate by making the adhesive member come into contact with a liquid solvent, e.g., alcohol (especially an alcohol with a small molecular weight such as ethanol or methanol), ketone, or a solvent produced by mixing alcohol with ketone and dissolving it.

The support plate is configured in various forms. Among these forms, a type produced by forming a large number of minute through holes in the thickness direction of the support plate (i.e., this type is called "support plate" in the present specification document) makes it possible to cause the above described solvent to come into contact, through the aforementioned through holes, with the adhesive member intervening between itself and the wafer. This configuration makes it possible to cause the majority of the above described adhesive member to react to the above described liquid solvent in a short time.

Note that the configuration of the support plate made of iron-nickel alloy and provided with the above described through holes is disclosed in reference patent document 1 and others.

When the support plate provided with through holes is used as a support member for a wafer as described above, the support plate is detached from the wafer by supplying the adhesive member with a liquid solvent through the large number of through holes. When the liquid solvent is accumulated in the through holes, the dissolution progresses successively from the adhesive member exposed to the opening part of the through hole toward the inside of the adhesive member.

[Patent document 1] Laid-Open Japanese Patent Application Publication No. 2005-191550

In the conventional apparatus, a liquid solvent remains in the above described through holes, hampering smooth circulation of the liquid solvent, and therefore a substantial length of time is actually required until the liquid solvent reacts with the better part of the adhesive member. The fact that the reaction time takes a substantial length of time is a problem because the reaction time directly affects the production efficiency.

SUMMARY OF THE INVENTION

The present invention aims at providing a liquid solvent abutment unit for speeding up a reaction of a liquid solvent dissolving an adhesive member existing between a support plate and a wafer.

One of the aspects of a liquid solvent abutment unit according to the present invention comprises: a supply part for supplying a support plate surface with a liquid solvent; a retention part for retaining the supplied liquid solvent in the hole-formed region on the support plate surface; a recovery part for recovering the liquid solvent retained in the hole-formed region; and a vibration unit for vibrating the liquid solvent.

In the liquid solvent abutment unit, the retention part is an enclosure member for forming a retention-use space in the hole-formed region on the support plate surface and preferably further comprises a detection unit for detecting an event of the retention-use space being filled with the liquid solvent.

Further, the liquid solvent abutment unit preferably further comprises: a temperature adjustment unit for adjusting the temperature of the liquid solvent supplied to the support plate surface, and a control unit for controlling the vibration of the vibration unit in accordance with the temperature of the liquid solvent, the state of the retention of the liquid solvent, and the processing sequence.

The liquid solvent abutment unit according to the present invention comprises the supply part and recovery part for the liquid solvent, thereby generating the flow of the liquid solvent supplied to the retention part and improving the circulation of the liquid solvent within the through holes of the support plate. Further comprising the vibration unit enables the vibration of the liquid solvent within the through holes. This configuration accelerates the reaction of the liquid solvent dissolving the adhesive member existing between the support plate and wafer, thereby greatly shortening the time to detach the support plate from the wafer.

BRIEF DESCRIPTION OF THE DRAWINGS

FIG. 2 is a diagram showing a usage state of the liquid solvent abutment unit;

FIG. 3 is a diagram showing an exemplary configuration (part 2) of a liquid solvent abutment unit according to a preferred embodiment of the present invention; and FIG. 4 is a diagram showing an exemplary configuration (part 3) of a liquid solvent abutment unit according to a preferred embodiment of the present invention.

BRIEF DESCRIPTION OF THE DRAWINGS

Figure 1:
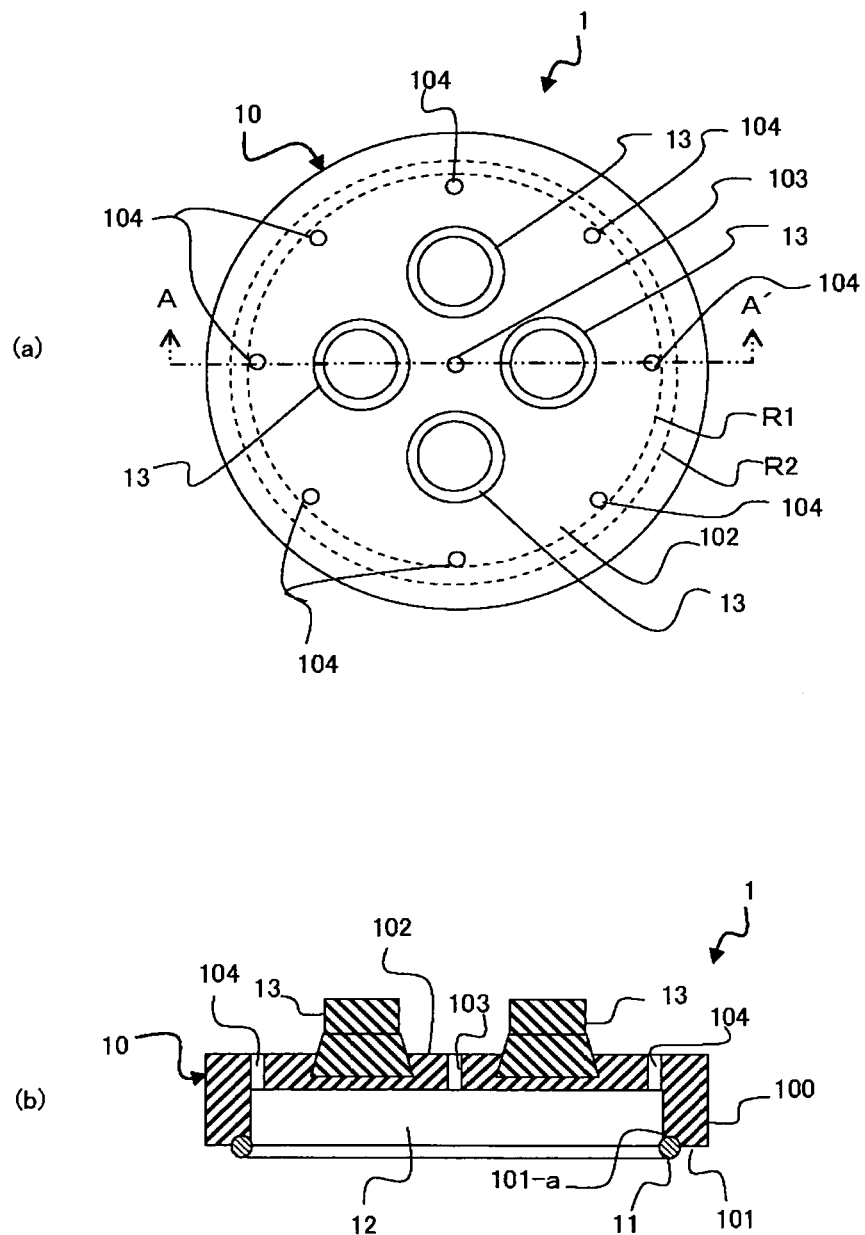
FIG. 1 is a diagram showing an exemplary configuration (part 1) of a liquid solvent abutment unit according to a preferred embodiment of the present invention.

The following is a description, in detail, of the preferred embodiment of the present invention by referring to the accompanying drawings.

FIG. 1 is the diagram of the configuration of a liquid solvent abutment unit according to a preferred embodiment of the present invention. FIG. 1(*a*) is a plan view diagram of the liquid solvent abutment unit; and FIG. 1(*b*) is the cross-sectional diagram at the position along the line A-A indicated in FIG. 1(*a*).

The liquid solvent abutment unit 1 shown in FIG. 1 comprises: a retention part for retaining a liquid solvent; and a vibration part for vibrating the liquid solvent.

The liquid solvent abutment unit 1 comprises an enclosure member 10 in which an enclosure wall 100 extended downward is connected to the circumferential part of a flat plate 102. A groove 101a is formed along the inner circumference of the lower end surface 101 of the enclosure wall 100, that is, between the dotted line circles R1 and R2 on the inner and outer sides, respectively, as shown in FIG. 1(a), and an O-ring 11 is fitted into the groove 101a to prevent the liquid solvent from leaking.

Two kinds of holes, that is, a first through hole 103 and a plurality of second through holes 104, are made in the thickness direction of the flat plate 102 that is positioned inside of the enclosure wall 100. In this configuration, the first through hole 103 is placed at the center of the flat plate 102 and eight of the second through holes 104 are placed near to the enclosure wall 100, that is, at equal intervals in the circumferential direction.

The vibration part is provided to vibrate the region in which the liquid solvent is supplied. In this configuration, vibrators 13 are equipped as the vibration parts within the thickness of the flat plate 102, specifically, near a space (which is later called "retention-use space" herein) 12 formed by the enclosure member 10 so that the vibrators 13 vibrate in the direction of the space 12, as shown in FIGS. 1(a) and (b). Note that each of the vibrators 13 is connected to a drive circuit (not shown in the figure) by which the vibration is controlled.

FIG. 2 is a diagram showing a usage state of the liquid solvent abutment unit 1. The liquid solvent abutment unit 1 shown in FIG. 2(a) is similar to the cross-sectional diagram of the liquid solvent abutment unit 1 shown in FIG. 1(b). FIG. 2(b) is the enlargement diagram of the part B enclosed by the single-dot chain line as indicated in FIG. 2(a).

As shown in FIG. 2(a), the liquid solvent abutment unit 1 is used with the O-ring 11 pressed onto the surface of the support plate S. Specifically, the O-ring 11 is pressed on the surface of the support plate S opposite to the surface on which a wafer W is adhesively attached so as to enclose a region in which the through holes H (indicated by the vertical stripes as shown in FIG. 2(a)) are formed, which is called a hole-formed region, and a retention-use space 12 enclosed by the enclosure member 10 and O-ring 11 is formed in the space above the hole-formed region.

Then, the first through hole 103 is used as the hole for supplying the retention-use space 12 with the liquid solvent and the eight second through holes 104 are used as the holes for recovering the liquid solvent from the retention-use space 12 as indicated by the dotted line arrows shown in FIG. 2(a). Although not shown in FIG. 2(a), a possible example is one in which a supply apparatus configured to send the liquid solvent from a tank by applying a positive pressure is connected to the first through hole 103, and a recovery apparatus configured to recover the liquid solvent by applying a negative pressure is connected to the second through holes 104, with each connection using a freely flexible hose or the like.

Alcohol (especially a kind with a small molecular weight, such as ethanol or methanol), ketone, a solvent produced by mixing alcohol with ketone, or the like, any of which will dissolve the adhesive member, is used as the liquid solvent.

Connecting the first through hole 103 to the supply apparatus and connecting the second through holes 104 to the recovery apparatus causes the liquid solvent within the supply tank to enter the retention-use space 12 through the first through hole 103, and causes the liquid solvent accumulated within the retention-use space 12 to be sucked toward the recovery tank through the second through holes 104, as indicated by the dotted line arrows shown in FIG. 2(a).

In the meantime, each vibrator 13 vibrates upon receiving a signal from a vibrator drive unit 15 shown in FIG. 2(a), thereby causing the liquid solvent retained in the retention-use space 12 to vibrate.

FIG. 2(b) shows the situation within the through holes H in the support plate S when the above described event occurs. As described above, when the retention-use space 12 is supplied with the liquid solvent through the first through hole 103 and the liquid solvent is recovered through the second through holes 104, a convection current is generated within the retention-use space 12 by the liquid solvent. The convection current brings about a convection current also within each through hole H as shown in FIG. 2(b), causing the liquid solvent to circulate within the through hole H instead of being stationary therewithin. Furthermore, the liquid solvent filled in each through hole H vibrates, thereby further accelerating the reaction with the adhesive member AD due to the oscillation of the molecules.

Incidentally, if the retention-use space 12 is not filled with the liquid solvent when each vibrator 13 is driven, the vibration is extended to gas molecules existing in a space not filled with the liquid solvent. However, extending vibration to the gas molecules existing in a space not filled with the liquid solvent is not preferred, as is known through empirical studies. Therefore, the vibrator 13 is preferably driven after the retention-use space 12 is filled with the liquid solvent.

FIG. 3 is an exemplary configuration of a liquid solvent abutment unit that drives a vibrator 13 after a retention-use space 12 is filled with a liquid solvent.

The liquid solvent abutment unit 2 shown in FIG. 3 is configured to further equip the above described liquid solvent abutment unit 1 with a detection unit for detecting that the retention-use space 12 is filled with the liquid solvent.

As shown in FIG. 3, the present embodiment shows a configuration using a liquid level sensor 20 as the above described detection unit. The liquid level L of a liquid solvent is raised from a low level to a high level as indicated by the solid line arrow in FIG. 3 and accordingly the liquid level sensor 20 is placed at a position so as to enable a detection of whether the upper part of the space part 12 is filled with the liquid, e.g., at a position adjacent to the upper end of the space part 12. Then, only when a signal indicating that the space part 12 is filled with the liquid solvent is input from the liquid level sensor 20 is the vibrator 13 driven by the vibrator drive unit 15'.

Note that the enclosure member 10 may alternatively be inclined in place of being horizontal, as shown in FIG. 3. Further, the space part 12 may be oriented, for example, in an upward direction instead of in a downward direction, as shown in FIG. 3. In such a case, the above described liquid level sensor will be equipped at a position enabling detection as to whether a space of the retention-use space 12 in which the liquid solvent is filled last is filled with the aforementioned liquid solvent. Further, in order to enable usage in various orientations, an alternative configuration may be such that it is possible to detect, in a plurality of regions, whether or not the retention-use space 12 is filled with the liquid solvent. In such a case, the configuration equips liquid level sensors in a plurality of places and the vibrator drive unit 15' drives the vibrator 13 only when all the liquid level sensors input the respective signals communicating that the space part 12 is filled with the liquid solvent.

Meanwhile, in order to effectively react the adhesive member with the liquid solvent, the temperature of the liquid solvent needs to be kept at an appropriate level. However, vibrating the molecules of the liquid solvent actually causes the temperature of the liquid solvent to climb due to the vibration of the molecules. Therefore it is also important to adjust the temperature of the liquid solvent to an appropriate level with the influence of the vibration taken into consideration.

FIG. 4 is an exemplary configuration of a liquid solvent abutment unit configured so as to control a vibrator in accordance with the temperature of a liquid solvent.

The liquid solvent abutment unit 3 shown in FIG. 4 is configured to further equip the above described liquid solvent abutment unit 1 with a temperature adjustment unit 30 and a vibration control unit 31.

The temperature adjustment unit 30 comprises a temperature adjustment apparatus for measuring the temperature of the liquid solvent recovered through second through holes 104, and heating or cooling so that the liquid solvent to be supplied to a first through hole 103 is maintained at a predetermined temperature. Further, the vibration control unit 31 comprises a control circuit for controlling the drive unit 15" of the vibrator 13. The vibration control unit 31 controls the output of the drive unit 15" while monitoring the temperature of the recovered liquid measured by the temperature adjustment unit 30. For example, if the temperature of the liquid solvent measured by the temperature adjustment unit 30 exceeds a designated temperature, the vibration control unit 31 turns off the output of the drive unit 15", that is, stops the vibration, whereas if the aforementioned temperature is not higher than the designated temperature, the vibration control unit 31 turns on the output of the drive unit 15", that is, initiates the vibration.

Note that the vibration control unit 31 may alternatively be configured to increase or decrease the output value of the drive unit to a discretionary value, instead of turning on or off the drive unit 15".

Further, the temperature at dissolving the adhesive is preferably anywhere between 30 and 50 degrees centigrade, and the support plate may be detached from the wafer by controlling the temperature of the liquid solvent instead of using a vibration for the detachment, depending on the case.

Further, the liquid solvent abutment unit 3 shown in FIG. 4 may comprise a detection unit equipped in the liquid solvent abutment unit 2 shown in FIG. 3.

Meanwhile, the retention-use space is formed by the enclosure member 10 and O-ring 11 in the above description, it may, however, be formed in a different aspect. For example, the retention-use space may alternatively be formed by only an enclosure member without equipping it with an O-ring and a groove for fitting the O-ring. In such a case, the configuration includes a provision to maintain the distance between the enclosure member and support plate so as to prevent the liquid solvent from leaking due to the surface tension.

As described above, the liquid solvent abutment unit according to the preferred embodiment of the present invention is configured to form, using the enclosure member, a space, that is, the retention-use space, in the region for forming the through holes of the support plate for retaining the liquid solvent. It is further configured to make it possible to supply the retention-use space with the liquid solvent and also recover the liquid solvent therefrom. It is further configured to be equipped with the vibration unit so as to vibrate the liquid solvent supplied to the retention-use space. Therefore, this enables the liquid solvent to vibrate within the through holes in the hole-formed region of the support plate, and also causes the liquid solvent to circulate into and out of the through holes of the support plate. This in turn accelerates the reaction of the liquid solvent to dissolve the adhesive member, thereby completing detachment of the through-hole provided support plate from the wafer in short time.

Meanwhile, another configuration equipping the detection unit in the retention-use space for detecting an event of the retention-use space being filled with the liquid solvent makes it possible to not initiate a vibration when the aforementioned space is not filled with the liquid solvent, thereby avoiding vibrating gas molecules existing in the space not filled with the liquid solvent. Further, the equipping of the detection unit makes it possible to initiate a dissolving reaction by vibrating at an optimal timing.

Furthermore, the case of equipping the liquid solvent abutment unit with the temperature control unit and the vibration control unit for controlling the vibrator on the basis of the temperature of the liquid solvent makes it possible to prevent a temperature rise in the liquid solvent due to a continuous vibration. This configuration makes it possible to maintain the temperature of the liquid solvent within a designated range and supply the through hole of the support plate with the liquid solvent at the temperature optimal for the dissolving reaction, thereby causing the liquid solvent to react with the adhesive member. As a result, it is possible to attain the dissolving reaction by vibrating at the optimal temperature.

The invention claimed is:

1. A liquid solvent abutment unit, comprising:
    an enclosure member having a flat plate and an enclosure wall extending downward and connected to a circumferential part of the flat plate, the enclosure wall having a groove formed on a lower end surface of the enclosure wall, and an O-ring being fitted in the groove, the enclosure wall, the flat plate, and the O-ring defining a retention-use space, when the O-ring is pressed onto a support plate;
    a supply part configured to supply a surface of the support plate with a liquid solvent, such that the supplied liquid solvent is retained in the retention-use space, the supply part being disposed inside the enclosure wall and being a first through hole formed in a thickness direction of the flat plate;
    a retention part configured to retain the supplied liquid solvent supplied to the support plate surface, the retention part being disposed inside the enclosure wall and being a second through hole formed in the thickness direction of the flat plate;
    a temperature adjustment unit configured to measure and adjust a temperature of the supplied liquid solvent supplied to the support plate surface;
    a vibration unit configured to vibrate the supplied liquid solvent retained in the retention-use space; and
    a control unit configured to control the vibration of the vibration unit in accordance with the temperature of the supplied liquid solvent,
    wherein the control unit ceases vibration of the vibration unit when the temperature of the supplied liquid solvent measured by the temperature adjustment unit exceeds a predetermined temperature, and the control unit initiates vibration of the vibration unit when the temperature of the supplied liquid solvent measured by the temperature adjustment unit is at or below the predetermined temperature.

2. The liquid solvent abutment unit according to claim 1, wherein
    the liquid solvent abutment unit further comprises a detection unit configured to detect that the retention-use space is filled with the liquid solvent.

3. The liquid solvent abutment unit according to claim 1, wherein the O-ring is configured and arranged so as to prevent the liquid solvent from leaking.

4. The liquid solvent abutment unit according to claim 1, further comprising a plate substantially covering the retention part, and a recovery part, the recovery part being a plurality of through holes disposed in the plate.

5. The liquid solvent abutment unit according to claim 1, further comprising a plate substantially covering the retention part, wherein the first through hole is disposed in the center of the plate.

6. The liquid solvent abutment unit according to claim 5, wherein the vibration unit is disposed on the plate adjacent the supply part.

\* \* \* \* \*